United States Patent
Prevost et al.

(10) Patent No.: US 10,153,760 B2
(45) Date of Patent: Dec. 11, 2018

(54) RECONFIGURABLE DIRECT MAPPING FOR RF SWITCH CONTROL

(71) Applicant: pSemi Corporation, San Diego, CA (US)

(72) Inventors: Ethan Prevost, Poway, CA (US); Rahul Dubal, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 78 days.

(21) Appl. No.: 15/163,148

(22) Filed: May 24, 2016

(65) Prior Publication Data

US 2017/0346474 A1    Nov. 30, 2017

(51) Int. Cl.
*H03K 17/00* (2006.01)
*H03K 19/21* (2006.01)

(52) U.S. Cl.
CPC ........... *H03K 17/002* (2013.01); *H03K 19/21* (2013.01)

(58) Field of Classification Search
CPC .............................. H03K 17/002; H03K 19/21
See application file for complete search history.

(56) References Cited

U.S. PATENT DOCUMENTS 9,229,897 B2 *   1/2016   Iyer ..................... G06F 13/4291
2015/0055428 A1   2/2015   Henry et al.

* cited by examiner

*Primary Examiner* — Lincoln Donovan
*Assistant Examiner* — Colleen O Toole
(74) *Attorney, Agent, or Firm* — Jaquez Land Greenhaus LLP; Martin J. Jaquez, Esq.; John Land, Esq.

(57) ABSTRACT

A circuit architecture and process that provides for a dual-mode methodology for an RF integrated circuit (IC) switch circuit that allows switching between a direct mapping configuration and a fully decoded mapping configuration, and further provides for changing either mapping configuration after fabrication. A control word is selectively compared to a programmed map register value so that, in a first mode, only one bit position of a control word matches a decoded programmed map bit pattern, and in a second mode, all bits of a control word match a corresponding programmed map bit pattern. Because the map registers can be programmed at least once after IC fabrication, the exact mapping required for a particular application can be determined post fabrication. Further, the first mode of operation is often beneficial during testing because multiple RF signal paths can be turned on at the same time and thus tested in parallel.

33 Claims, 2 Drawing Sheets

RECONFIGURABLE DIRECT MAPPING FOR RF SWITCH CONTROL

BACKGROUND

(1) Technical Field

This invention relates to electronic circuitry, and more particularly to radio frequency (RF) switch circuits and switch control circuitry.

(2) Background

Electronic signal switches are used in a wide variety of applications. For example, a multiple-pole RF switch architecture has been found useful in applications which require multiple transmit and/or receive paths for RF signals, particularly in order to operate in different frequency bands. Such a switch architecture is useful in cellular radio and WiFi systems for coupling one or more antennas to multiple sets of transmit (Tx) and/or receive (Rx) circuitry. Other application examples include automatic test equipment and electronics laboratory bench measurement equipment.

FIG. 1 is a schematic diagram of a simplified single-pole, triple-throw (SP3T) field effect transistor (FET) based RF switch circuit 100. In the illustrated example, one or more of three transmit and/or receive paths Tx/Rx1-Tx/Rx3 may be coupled to a common antenna ANT through corresponding FET series switches controlled by control voltages A, B, and C, respectively. Each transmit path Tx/Rx1-Tx/Rx3 may also be coupled to circuit ground through a corresponding FET shunt switch controlled by control voltages $\overline{A}$, $\overline{B}$, and $\overline{C}$, respectively, which are the complements of control voltages A, B, and C. In a typical circuit, a corresponding logic signal $A_L$, $B_L$, $C_L$, is converted to both the control voltages A, B, and C and the complementary control voltages $\overline{A}$, $\overline{B}$, and $\overline{C}$ (for example, through a level shifter circuit, not shown).

As should be clear, the RF switch circuit 100 may have fewer or more signal paths Tx/Rxn (i.e., an SPnT switch configuration, where n≥1). In some applications, a signal path will be dedicated to only receive or to only transmit RF signals. The entire RF switch circuit 100 may be fabricated on an integrated circuit (IC) die with additional circuitry, such as control, voltage regulating, charge pump, and voltage level shifter circuits (not shown). In addition, the series and shunt switches may be implemented with other technologies, such as bipolar transistors, microelectromechanical systems (MEMS) switches, etc.

The series and shunt switches associated with each of the transmit or receive paths Tx/Rx1-Tx/Rx3 define a path selection element 102, as indicated by the dotted-line oval. Control circuitry generates a logic signal to enable signal conduction through a path selection element 102 by generating corresponding control voltages to set the associated series switch to CLOSED and the associated shunt switch to OPEN. Conversely, the control circuitry generates a logic signal to disable signal conduction through a path selection element 102 by generating corresponding control voltages to set the associated series switch to OPEN and the associated shunt switch to CLOSED.

The control voltage values (e.g., A/$\overline{A}$, B/$\overline{B}$, and C/$\overline{C}$) are typically generated from control circuitry that accepts a control word from an external source and converts the control word to a corresponding set of individual logic signals (e.g., $A_L$, $B_L$, and/or $C_L$) to enable or disable a particular path selection element 102. For example, a control word may represent settings for one or more frequency bands and be in the form of a binary word (e.g., 4, 8, 16, or 32 bits) provided by other circuits in a radio system.

FIG. 2 is a block diagram of conventional control circuit 200 for the RF switch circuit 100 of FIG. 1. In the illustrated example, an externally supplied control word is directly or indirectly written into one or more banks of control word registers 202 of an RF switch circuit 100 IC. A control word may be directly supplied on individual control lines or lanes (i.e., in parallel) or be serially supplied (for example, by means of the well-known Serial Peripheral Interface—SPI—serial bus) and converted from serial to parallel form. A written control word may then be used to address a simple mask programmable switch matrix 204. The purpose of the mask programmable switch matrix 204 is to map the binary bit values stored in the control word register(s) 202 to individual control line signals. The mask programmable switch matrix 204 is typically implemented by applying a mask to a metallization layer during fabrication of an IC.

In some applications, it may be desirable to control the RF switch circuit 100 through a method called "direct mapping". This method of control involves directly mapping a single control word register bit through the mask programmable switch matrix 204 to a corresponding individual logic signal $A_L$, $B_L$, or $C_L$, which in turn controls the enabled or disabled state of a path selection element 102 in the RF switch circuit 100. For example, if there are N banks of control word registers 202, then the third bit position of control word register number 2 (which may be represented as "BANK2[3]") could be direct mapped to the Tx/Rx3 path selection element 102 of the RF switch circuit 100 of FIG. 1. Accordingly, if the value written to BANK2[3] is a "1", then the Tx/Rx3 path selection element 102 would be enabled, and if the value written is a "0", then the Tx/Rx3 path selection element 102 would be disabled.

TABLE 1 sets forth an example of the direct mapping methodology for the RF switch circuit 100. In this example, the mask programmable switch matrix 204 is programmed to map bit positions B2-B0 of a control word written to one of the control word registers 202 (the bank number is omitted for clarity). Thus, if the third bit position, B2, of the control word value is a "1", then the Tx/Rx3 path selection element 102 will be enabled, regardless of the values in bit positions B0 and B1 ("x" indicates "don't care", meaning the bit value can be either a "0" or a "1"). Accordingly, the antenna ANT would be coupled to transmit and/or receive circuitry through the Tx/Rx3 path selection element 102. As another example, if register bits B2-B0 are all "0", then all path selection elements 102 Tx/Rxn are disabled, thus isolating the antenna ANT from all transmit and/or receive circuitry.

TABLE 1

| Control Word | | | |
| --- | --- | --- | --- |
| B2 | B1 | B0 | Selected Signal Path |
| 0 | 0 | 0 | All Disabled (isolated) |
| x | x | 1 | ANT-Tx/Rx1 |
| x | 1 | x | ANT-Tx/Rx2 |
| 1 | x | x | ANT-Tx/Rx3 |

TABLE 2 sets forth another example of the direct mapping methodology for the RF switch circuit 100. As in TABLE 1, in this example, the mask programmable switch matrix 204 is programmed to map bit positions B2-B0 of a control word written to a control word register 202 (again, the bank number is omitted for clarity). However, the TABLE 2 mappings are to different signal paths; in particular, a control word value of "xx1" is mapped to the Tx/Rx3 signal path (rather than to the Tx/Rx1 signal path, as in TABLE 1) and a control word value of "1xx" is mapped to the Tx/Rx1 signal path (rather than to the Tx/Rx3 signal path).

TABLE 2

| Control Word | | | |
|---|---|---|---|
| B2 | B1 | B0 | Selected Signal Path |
| 0 | 0 | 0 | All Disabled (Isolated) |
| x | x | 1 | ANT-Tx/Rx3 |
| x | 1 | x | ANT-Tx/Rx2 |
| 1 | x | x | ANT-Tx/Rx1 |

The control word mapping may differ for different applications due to constraints imposed by other circuits that provide the control words. For example, the same RF switch circuit 100 may be used in different RF systems (e.g., different cellular radio handsets) that have different central processing unit ICs that output control words in different formats.

Prior known implementations of the direct methodology do not allow for reconfigurability. Once an RF switch circuit 100 is fabricated on an IC, the direct mapping in the mask programmable switch matrix 204 cannot be changed. In the above examples, if BANK2[3] is direct mapped in an IC to the Tx/Rx1 path selection element 102, it will always be direct mapped to the Tx/Rx1 path selection element 102 for that IC; the only way to change the mapping requires fabricating a new IC using a different programming mask.

Accordingly, there is a need for a circuit architecture and process that provides for changing a direct mapping configuration of an RF switch circuit after IC fabrication. The present invention meets this need and provides an additional dual-mode functionality.

SUMMARY OF THE INVENTION

The present invention encompasses a circuit architecture and process that provides for a dual-mode methodology for an RF integrated circuit (IC) switch circuit that allows switching between a direct mapping configuration and a fully decoded mapping configuration, and further provides for changing the direct mapping configuration and/or fully decoded mapping configuration after fabrication.

In one embodiment, a control word from an external source is directly or indirectly written into one or more groups (or "banks") of control word registers on an RF switch circuit IC. The stored control words are coupled by control word lines to respective inputs of a full-word bitwise comparator and of a single-bit position bitwise comparator. Also coupled to the full-word bitwise comparator and the single-bit position bitwise comparator (through a decoder in the latter case) are one or more banks of addressable map registers that store configuration data. The outputs of the bitwise comparators are selectable as logic signal outputs to control associated path selection elements (or switch "throws") of an RF switch circuit IC.

In a first mode of operation, a programmable direct mapping methodology is implemented by configuring the map registers to map control words from the control word registers to determine which control word register and set of one or more control word register bits are associated with (direct mapped to) particular logic control lines, and thus to particular corresponding path selection elements. In this mode, the content of the map registers for each switch throw includes a binary coded address of the direct map bit position that controls that switch throw, and additionally includes an enable/disable bit. The address is decoded to signals on individual bit lines which are in turn coupled to an input of the single-bit position bitwise comparator. The single-bit position bitwise comparator accepts two input operands, performs a logical comparison operation on corresponding bits of the operands, essentially using the decoded address value from the map register as a "mask" for a corresponding stored control word, and then performs a logical operation on the resulting bits to determine if the mask bit was present in the control word; if so, the associated path selection element is switched to a CLOSED state; if not, the associated path selection element is switched to an OPEN state.

In a second mode of operation, a programmable fully decoded mapping methodology is implemented by configuring the map registers to map control words from the control word registers to determine which coded control word register values are associated with particular logic control lines, and thus to a particular corresponding path selection element. In this mode, the content of the map registers for each switch throw includes a binary coded value (not address) that controls that switch throw. The binary coded value is coupled to an input of the full-word bitwise comparator. The full-word bitwise comparator accepts two input operands, performs a logical comparison operation on all corresponding bits of the operands, essentially comparing each bit position of the coded value from the map register to the bit positions of a corresponding stored control word, and then performs a logical operation on the resulting bits to determine if the control word exactly matches the corresponding map register value; if so, the associated path selection element is switched to a CLOSED state; if not, the associated path selection element is switched to an OPEN state.

Because the map registers can be programmed at least once after IC fabrication, the exact mapping required for a particular application can be determined post fabrication. This eliminates the costly requirements of fabricating a new mask-programmed design and gives an extra degree of control of the path selection elements. Thus, units of one switch IC design can be fabricated and then selectively programmed as needed for different applications. Further, the first mode of operation eliminates the need for a control word decoder and provides flexible control over each individual path selection element in an RF switch circuit configuration. The first methodology also is often beneficial during testing because multiple RF signal paths can be turned on at the same time and thus tested in parallel.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The present invention encompasses a circuit architecture and process that provides for a dual-mode methodology for an RF integrated circuit (IC) switch circuit that allows switching between a direct mapping configuration and a fully decoded mapping configuration, and further provides for changing the direct mapping configuration and/or fully decoded mapping configuration after fabrication.

Figure 3:
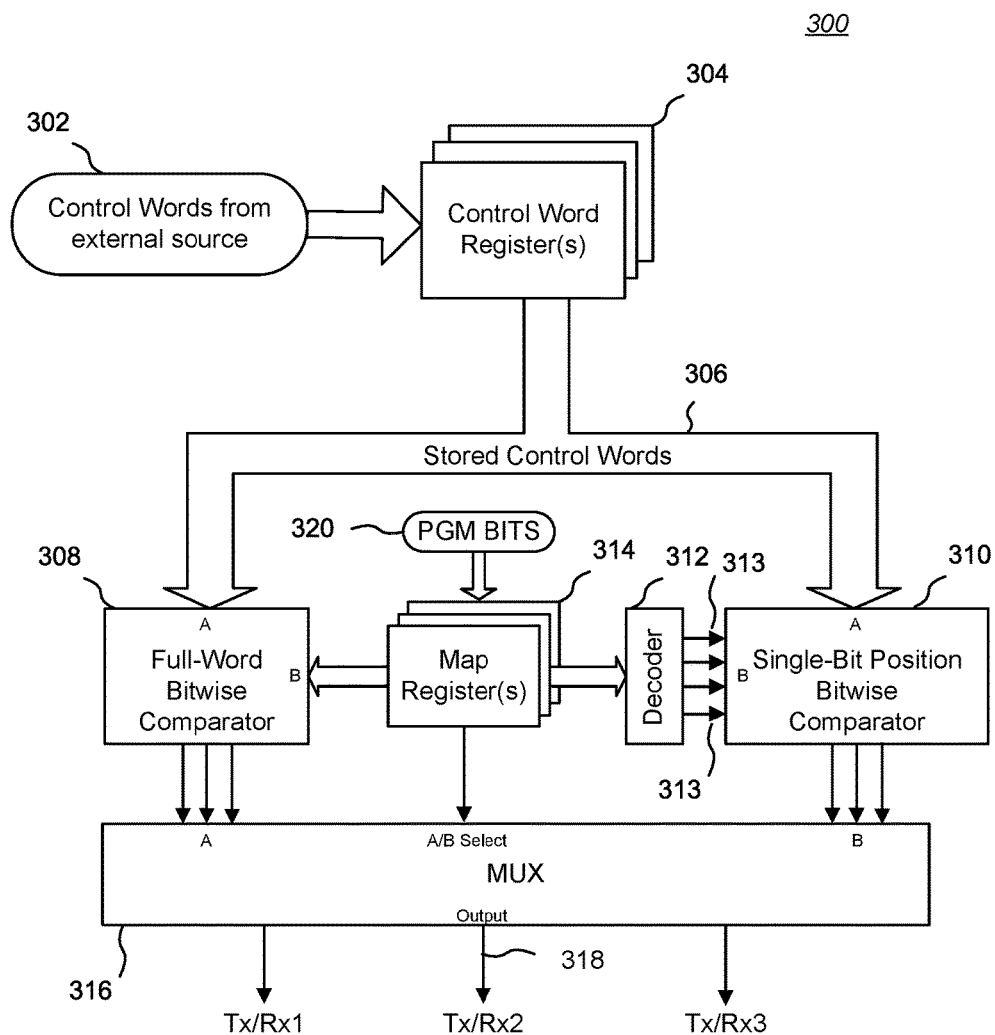
FIG. 3 is a block diagram of one embodiment of the present invention.

FIG. 3 is a block diagram of one embodiment 300 of the present invention. The illustrated embodiment is a depiction of functional logic blocks, but is only one way of implementing the inventive concepts. In the embodiment illustrated in FIG. 3, a control word from an external source 302 is directly or indirectly written into one or more groups (or "banks") of control word registers 304 on an RF switch circuit IC. A control word may, for example, represent settings for one or more frequency bands, and is generally in the form of a binary word (e.g., 4, 8, 16, or 32 bits). A control word may be directly supplied on individual control lines or lanes (i.e., in parallel) or be serially supplied (for example, by means of the well-known Serial Peripheral Interface—SPI—serial bus) and converted from serial to parallel form.

The stored control words are coupled by control word lines 306 to respective inputs of a full-word bitwise comparator 308 and of a single-bit position bitwise comparator 310. Also coupled to the full-word bitwise comparator 308 and the single-bit position bitwise comparator 310 (through a decoder 312 in the latter case, as described below) are one or more banks of addressable map registers 314 that store configuration data. The outputs of the full-word bitwise comparator 308 and the single-bit position bitwise comparator 310 are coupled to a multiplexer 316, which selectively outputs one set of outputs as logic signals 318 under the control of a selection bit that may be stored in the map registers 314. In an alternative embodiment, the outputs of the full-word bitwise comparator 308 and the single-bit position bitwise comparator 310 may be "tristate" capable (meaning that an output port can be set to a high impedance state, in addition to "0" and "1" logic levels, effectively removing the output from the circuit) under the control of a selection bit that may be, for example, stored in the map registers 314 or supplied from an external source. In such an embodiment, the outputs of the full-word bitwise comparator 308 and the single-bit position bitwise comparator 310 may be directly coupled together in a "wired OR" arrangement, since either of them may be effectively removed from the circuit by the selection bit.

Figure 1:
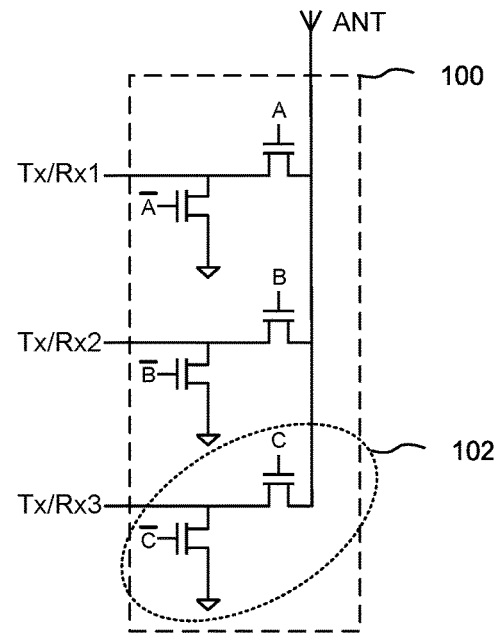
FIG. 1 is a schematic diagram of a simplified single pole, triple throw (SP3T) field effect transistor (FET) based RF switch circuit.
Figure 2:
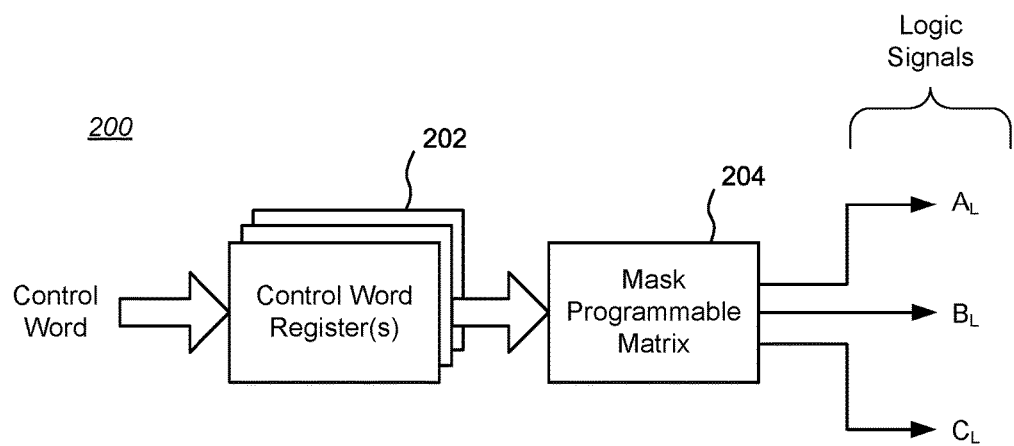
FIG. 2 is a block diagram of conventional control circuit for the RF switch circuit of FIG. 1.

An addressable set of bit positions within a map register 314 can be associated with a particular path selection element 102 (or switch "throw") of an RF switch circuit IC. The configuration data maps switch-state bits within control words to output logic signals 318 that correspond to path selection elements 102 for Tx/Rxn signal paths of an RF switch circuit, such as the type shown in FIG. 1. As described above, the logic signals are converted to appropriate control voltages for the path selection elements 102 (conversion circuit not shown). The switch-state bits of each control word register 304 correspond to specific bit positions of at least one register within the map registers 314; additional map registers that do not correspond to a control word register 304 may also be included to store various control codes.

The map registers 314 may be implemented as a one-time, post-fabrication writeable read-only memory circuit (e.g., a set of fuses, a fuse/anti-fuse PROM, a programmable logic device, etc.), or as a re-writeable memory circuit (e.g., EPROM, EEPROM, EAROM, etc.). The map registers 314 are addressed and programmed from an external source 320 of programming bit values at least once after IC die fabrication is complete by means of externally supplied programming bits, which may be provided, for example, through internal control pads after IC fabrication but before packaging (and thus not customer accessible), or over an SPI or other serial bus, or by any other convenient means.

Direct Mapping Mode of Operation

The configuration shown in FIG. 3 enables two modes of operation. An additional control bit is used to determine the mode of operation, as described in further detail below.

In the first mode of operation, a programmable direct mapping methodology is implemented by configuring the map registers 314 to map control words from the control word registers 304 to determine which control word register and set of one or more control word register bits are associated with (direct mapped to) particular logic control lines 318, and thus to a particular corresponding path selection element 102 (or switch "throw") of an RF switch circuit. In this mode, the content of the map registers 314 for each switch throw includes a binary coded address of the direct map bit position that controls that switch throw, and additionally includes an enable/disable bit. The binary coded address (e.g., the binary coded number "011" [decimal 3]) is decoded through a conventional decoder 312 to signals on individual bit lines 313 Bn. For example, the binary coded number "011" decodes to bit lines B3="1", B2="0", B1="0", B0="0", or more compactly, as {1000}. The decoded bit lines 313 Bn are in turn coupled to an input of the single-bit position bitwise comparator 310. In some embodiments, the decoding function of the decoder 312 may be performed within the single-bit position bitwise comparator 310 circuit block.

The enable/disable bit is required in order to disable a signal path. Without it, a signal path cannot be disabled. However, if no signal path is ever desired to be disabled, then the enable/disable bit is optional.

In the illustrated embodiment, the single-bit position bitwise comparator 310 accepts two input operands (one each from the control word registers 304 and the map registers 314), performs a logical comparison operation (e.g., an AND operation) on corresponding bits of the operands, essentially using the decoded address value from the map register 314 as a "mask" for a corresponding stored control word, and then performs a logical operation (e.g., an OR operation) on the resulting bits to determine if the mask bit was present in the control word. Some output values may be inverted to make the logic easier.

For example, as noted above, a map register binary coded address of "011" [decimal 3]) decodes to a bit pattern of {1000}; the "1" value in the bit pattern is a mask bit. If a corresponding control word has any binary coded value that includes a "1" in the B3 bit position (i.e., {1xxx}, where "x" indicates "don't care"), then logically AND'ing the decoded map register address bit pattern of {1000} to the control word bit values of {1xxx} will result in a bit pattern of {1000}. Logically OR'ing that resultant bit pattern will output a "1", indicating that the mask bit was present in the control word. Conversely, if the control word bit values where {0xxx}, then the final result would be a "0", indicating that the mask bit was not present in the control word. The final output value may then be logically AND'd with the enable/disable bit of the corresponding map register (possibly with inversion of one of the operands to make the logic easier) to determine whether a corresponding path selection element 102 is disabled or enabled (as determined by the enable/disable bit of the map register 314) and is to be switched to an OPEN or CLOSED state (as determined by the corresponding control word). As should be clear, an equivalent result may be obtained by other logical operations.

As should be clear, an equivalent result may be obtained by other logical operations. For example, the AND plus OR logical operations given as examples above can be replaced by NAND plus NAND logical operations. As another example, this methodology can use complementary logic, and thus a NOR and OR logical operations could work as well. In this latter case, an address for a "1" in the B3 bit position could be decoded out to be {0111}, where it is then NOR'd with a control word {0xxx} and OR'd to turn on a signal path.

TABLE 3 shows a more detailed example of how a map register 314 may be configured to map control words in one or more banks of control word registers 304 to individual logic control lines 318. The table represents direct mapping of control word values for an SP3T switch in which 12 bits are used to control enablement and the direct mapping of all three throws (i.e., 4 bits are associated with each throw). In this implementation, one bit is used to enable or disable control of a path selection element 102, and three bits are used to represent the address of a direct mapped bit. Each 4-bit set of map register bits is associated with a path selection element 102 for a Tx/Rxn signal path, as indicated by the Function column. As should be clear, the table can be extended to additional throws of a switch circuit, such as 4, 8, 12, or more throws, and the association of map register bits to path selection elements 102 for Tx/Rxn signal paths can be rearranged in various embodiments (e.g., in a different IC layout, BANK1[11:8] could be associated with Tx/Rx1 instead of Tx/Rx3).

TABLE 3

| Map Register Bits | Function | Comment |
| --- | --- | --- |
| BANK1[2:0] | ANT-Tx/Rx1 | Address of Direct Map Bit for Tx/Rx1 |
| BANK1[3] | | 0 = Enable Path |
| | | 1 = Disable Path |
| BANK1[6:4] | ANT-Tx/Rx2 | Address of Direct Map Bit for Tx/Rx2 |
| BANK1[7] | | 0 = Enable Path |
| | | 1 = Disable Path |
| BANK1[10:8] | ANT-Tx/Rx3 | Address of Direct Map Bit for Tx/Rx3 |
| BANK1[11] | | 0 = Enable Path |
| | | 1 = Disable Path |

For example, if the BANK1[7:4] bit positions of a map register 314 have been programmed with a value of "0011", then the "0" value in BANK1[7] indicates that the corresponding path selection element 102 for the Tx/Rx2 signal path is enabled. The binary coded address of "011" in BANK1[6:4] indicates (after decoding to {1000}) that the value in the register bit position B3 (in the 4-bit sequence B3-B0) of the associated control word register bank is direct mapped to and thus controls the switch state of the path selection element 102 for the Tx/Rx2 signal path. In particular, the path selection element for the 102 Tx/Rx2 signal path will couple the antenna ANT to the Tx/Rx2 signal path when the value "1xxx" is written in the BANK1[7:4] control word register. Conversely, if BANK1[7]="1" then the corresponding path selection element 102 for the Tx/Rx2 signal path is disabled regardless of the address value in BANK1[6:4].

Because the map registers 314 can be programmed at least once after IC fabrication, the exact mapping required for a particular application can be determined post fabrication. This eliminates the costly requirements of fabricating a new mask-programmed design and gives an extra degree of control of the path selection elements 102. Thus, units of one switch IC design can be fabricated and then selectively programmed as needed for different applications. For example, if the BANK1[7:4] bit positions of the map registers 314 have been programmed with a value of "0001", then the "0" value in BANK1[7] indicates that the corresponding path selection element 102 for the Tx/Rx2 signal path is enabled, and the binary coded address of "001" in BANK1[6:4] indicates (after decoding to {0010}) that the value in the register bit position B1 (rather than bit position B3 in the 4-bit sequence B3-B0, as in the example of the preceding paragraph) of the associated control word register bank is direct mapped to and thus controls the switch state of the path selection element 102 for the Tx/Rx2 signal path.

This first mode of operation eliminates the need for a control word decoder and provides flexible control over each individual path selection element 102 in an RF switch circuit configuration. For example, such flexibility is often beneficial during testing because multiple RF signal paths can be turned on at the same time by setting multiple control word bit positions to "1" (or to all "0's", if complementary comparison logic is used), thus concurrently enabling a plurality of path selection elements 102 so that testing of the enabled signal paths can be conducted in parallel. The flexibility of this methodology is also beneficial for applications that require concurrent connection of multiple path selection elements 102, such as in carrier aggregation, a technique that has been developed to increase bandwidth for RF radio systems, particularly cellular telephone systems.

Fully-Decoded Mapping Mode of Operation

In the second mode of operation, a programmable fully decoded mapping methodology is implemented by configuring the map registers 314 to map control words from the control word registers 304 to determine which coded control word register values are associated with particular logic control lines 318, and thus to a particular corresponding path selection element 102 (or switch "throw") of an RF switch circuit. In this mode, the content of the map registers 314 for each switch throw includes a binary coded value (not address) that controls that switch throw. The binary coded value (e.g., the binary coded number "011" [decimal 3]) is coupled to an input of the full-word bitwise comparator 308.

In the illustrated embodiment, the full-word bitwise comparator 308 accepts two input operands (one each from the control word registers 304 and the map registers 314), performs a logical comparison operation (e.g., an XOR operation) on corresponding bits of the operands, thus essentially comparing each bit position of the binary coded value from the map register 314 to the bit positions of a corresponding stored control word, and then performs a logical operation (e.g., an AND operation) on the resulting bits to determine if the control word exactly matches the corresponding map register value. Some output values may be inverted to make the logic easier.

For example, if a binary coded map register value of "0011" [decimal 3]) is bitwise logically XOR'd to a control word value of "0011", the resulting bit pattern will be {0000}. Inverting that value to {1111} and AND'ing all of the bit positions values will output a "1", indicating that the control word exactly matches the map register value. Conversely, if the control word value was "0001", then XOR'g that value to a coded map register value of "0011" will result in a bit pattern of {0010}. Inverting that value to {1101} and AND'ing all of the bit positions values will output a "0", indicating that the control word exactly did not exactly the map register value. The final output value determines whether a path selection element 102 for the Tx/Rxn signal path is to be switched to an OPEN or CLOSED state.

As should be clear, an equivalent result may be obtained by other logical operations. For example, rather than inverting and then AND'ing the bit positions values from the XOR operation, those bit positions values may be logically OR'd together, with a "0" result indicating that the control word exactly matches the map register value. As another example, a subtraction circuit could be used to subtract one operand from the other operand, with a "0" result indicating that the control word exactly matches the map register value.

TABLE 4 shows a more detailed example of how a map register 314 may be configured to map control words in one or more banks of control word registers 304 to individual logic control lines 318. The table represents a fully coded mapping of control word values for an SP3T switch in which 12 bits are used to map fully coded values to all three throws (i.e., 4 bits are associated with each throw in this example; obviously, 4 bits could represent 16 throws). Each 4-bit set of map register bits is associated with a path selection element 102 for a Tx/Rxn signal path, as indicated by the Function column. As should be clear, the table can be extended to additional throws of a switch circuit, such as 4, 8, 12, or more throws, and the association of map register bits to path selection elements 102 for the Tx/Rxn signal paths can be rearranged in various embodiments (e.g., BANK1[11:8] could be associated with Tx/Rx1 instead of Tx/Rx3 in a different IC layout).

TABLE 4

| Map Register Bits | Function | Comment |
| --- | --- | --- |
| BANK1[3:0] | ANT-Tx/Rx1 | Utilize XOR comparator logic for TX1 |
| BANK1[7:4] | ANT-Tx/Rx2 | Utilize XOR comparator logic for TX2 |
| BANK1[11:8] | ANT-Tx/Rx3 | Utilize XOR comparator logic for TX3 |

Again, because the map registers 314 can be programmed at least once after IC fabrication, the exact mapping required for a particular application can be determined post fabrication. This eliminates the costly requirements of fabricating a new mask-programmed design and gives an extra degree of control of the path selection elements 102. Thus, units of one switch IC design can be fabricated and then selectively programmed as needed for different applications. For example, if the BANK1[7:4] bit positions of the map registers 314 have been programmed with a value of "0001", then a matching associated control word register controls the switch state of the path selection element 102 for the Tx/Rx2 signal path. By programming a different value in the BANK1[7:4] bit positions of the map registers 314, a different matching value for the corresponding control word is required to control the switch state of the path selection element 102 for the Tx/Rx2 signal path.

It may be useful in some embodiments to include one or more additional bits in the map registers 314 used for the fully-decoded mapping methodology. For example, one extra bit per set of bits associated with each path selection element 102 may be used to enable or disable a signal path. Such functionality may be useful, for example, to configure an IC with a large number of path selection elements 102 (e.g., 12 or 16) so as to enable only a smaller number (e.g., 4 or 8) of path selection elements 102 and permanently disable the remaining path selection elements 102.

Combined Embodiment

TABLE 5 is a combined version of TABLE 3 and TABLE 4. In this example, the value of a control bit within the map registers 314 (e.g., BANK0[1]) acts as a "select" function between a fully coded mapping or a direct mapping mode of operation. However, the selection function may be provided by a separate control line or by a special control word register bit position if it is desired to be able to dynamically change the mode of operation. As should be clear, the table can be extended to additional throws of a switch circuit, such as 4, 8, 12, or more throws, and the association of map register bits to path selection elements 102 for the Tx/Rxn signal paths can be rearranged in different IC layouts.

In the illustrated example, if the value of BANK0[1]="0", the fully coded mapping mode of operation is selected. In this case, if BANK1[7:4]="0011", then the path selection element 102 for the Tx/Rx2 signal path will couple the antenna ANT to the signal path Tx/Rx2 only when the coded binary value "0011" is written to the associated control word register. Accordingly, all of the bits of the control word must be matched by the map register value to determine the associated path selection element 102.

As another example, if the value of BANK0[1]="1", the direct map mode of operation is selected. In this case, if BANK1[7:4]="0011", indicating that the B3 register bit position of the associated control word is to be direct mapped, then the path selection element 102 for the Tx/Rx2 signal path will couple the antenna ANT to the signal path Tx/Rx2 when "1xxx" is written to the associated control word register. Accordingly, only the addressed direct mapped bit of the control word is required to determine the associated path selection element 102.

TABLE 5

| Condition | MapRegister Bits | Function | Comment |
| --- | --- | --- | --- |
| BANK0[1] = 0 | BANK1[3:0] | ANT-Tx/Rx1 | Utilize XOR comparator logic for TX1 |
|  | BANK1[7:4] | ANT-Tx/Rx2 | Utilize XOR comparator logic for TX2 |
|  | BANK1[11:8] | ANT-Tx/Rx3 | Utilize XOR comparator logic for TX3 |
| BANK0[1] = 1 | BANK1[2:0] | ANT-Tx/Rx1 | Address of Direct Map Bit for TX1 |
|  | BANK1[3] |  | 0 = Enable Path 1 = Disable Path |
|  | BANK1[6:4] | ANT-Tx/Rx2 | Address of Direct Map Bit for TX2 |
|  | BANK1[7] |  | 0 = Enable Path 1 = Disable Path |
|  | BANK1[10:8] | ANT-Tx/Rx3 | Address of Direct Map Bit for TX3 |
|  | BANK1[11] |  | 0 = Enable Path 1 = Disable Path |

The logic expressed in combined TABLE 5 may be implemented in many alternative embodiments to the circuit shown in FIG. 3. For example, different combinatorial logic circuits may be used for the full-word bitwise comparator 308 and the single-bit position bitwise comparator 310 to implement the functionality described above. As another example, a programmable logic array (PLA) may be used to selectively and alternatively map a control word register to a path selection element 102 so that either all bits of a control word match a corresponding programmed pattern, or only one bit position of a control word matches a programmed pattern. Once a mode of operation is selected, a control word from the control word registers 304 may be used as an address to the PLA, which will perform the selected comparison operation and output a control signal for an associated path selection element 102 for a Tx/Rxn signal path.

Further, since the map registers 314 can be arranged in banks, a control line, bit, or bit pattern may select among multiple banks of map registers 314 having different mapping values/address, providing additional flexibility in using one basic IC layout to meet the needs of different applications. In addition, the map registers 314 of a particular IC implementation may be initially configured with a default mapping to associated path selection elements 102 to facilitate a testing protocol (e.g., so that the corresponding Tx/Rxn signal paths are tested in a particular order). Thereafter, the map registers 314 may be programmed with a different mapping to meet the needs of a particular application.

Methods

Another aspect of the invention includes a method for setting a switch state configuration of a radio frequency integrated circuit (IC) switch circuit, including the steps of: (a) selectably comparing a control word value, intended to select a state for a corresponding path selection element 102 of the IC switch circuit, to programmed binary coded bit values associated with a path selection element 102 of the IC switch circuit, and setting a particular state for the path selection element 102 associated with the programmed binary coded bit values if the compared values fully match; (b) selectably comparing the control word value to decoded programmed binary coded bit values representing a control word value bit position within the control word value, and setting a particular state for the path selection element 102 associated with the decoded programmed binary coded bit values if the decoded control word value bit position matches a corresponding bit position value within the control word value; and (c) selecting only one of the step (a) or step (b) comparisons at a time.

Yet another aspect of the invention is a method for setting a switch state configuration of a radio frequency integrated circuit (IC) switch circuit, including: providing at least one control word register, each for storing a control word value intended to select a state for a corresponding path selection element 102 of the IC switch circuit; providing at least one programmable map register, each for storing programmed bit values associated with a path selection element 102 of the IC switch circuit; providing a first bitwise comparator, coupled to the at least one control word register and to the at least one programmable map register, for comparing binary coded bit values stored in a selected programmable map register to the control word value stored in a corresponding control word register, for setting a particular state for the path selection element 102 associated with the selected programmable map register if the compared values fully match; and providing a second bitwise comparator, coupled to the at least one control word register and coupled to the at least one programmable map register though a decoder, for comparing decoded binary coded bit values stored in a selected programmable map register, the binary coded bit values representing a control word bit register address, to the control word value stored in a corresponding control word register, for setting a particular state for the path selection element 102 associated with the selected programmable map register if the decoded control word bit register address matches a corresponding bit position value within the control word value.

Still another aspect of the invention is a method for enabling switching between a direct mapping configuration and a fully decoded mapping configuration of a radio frequency integrated circuit (IC) switch circuit, including: providing at least one control word register, each for storing a control word value intended to select a state for a corresponding path selection element 102 of the IC switch circuit; providing at least one programmable map register, each for storing programmed bit values associated with a path selection element 102 of the IC switch circuit; providing a first bitwise comparator, coupled to the at least one control word register and to the at least one programmable map register, for comparing binary coded bit values stored in a selected programmable map register with the control word value stored in a corresponding control word register, for setting a particular state for the path selection element 102 associated with the selected programmable map register if the compared values fully match; providing a second bitwise comparator, coupled to the at least one control word register and coupled to the at least one programmable map register though a decoder, for comparing decoded binary coded bit values stored in a selected programmable map register, the binary coded bit values representing a control word bit register address, to the control word value stored in a corresponding control word register, for setting a particular state for the path selection element 102 associated with the selected programmable map register if the decoded control word bit register address matches a corresponding bit position value within the control word value; and enabling operation of only one of the first bitwise comparator and the second bitwise comparator at a time.

Another aspect of the invention is a method for setting a switch state configuration of an RF IC switch circuit, including configuring a comparison circuit to receive at least one programmable binary coded mapping value representing a control word bit position and to receive at least one control word intended to select a state for a corresponding mapped path selection element of the IC switch circuit, comparing a selected decoded binary coded mapping value to a corresponding control word, and setting a particular state for the corresponding mapped path selection element if the decoded binary coded mapping values matches a corresponding bit position value within the control word.

Yet another aspect of the invention is a method for setting a switch state configuration of an RF IC switch circuit, including storing at least one control word value intended to select a state for a corresponding path selection element of the IC switch circuit, storing at least one programmed bit value associated with a path selection element of the IC switch circuit, bitwise comparing a decoded binary coded bit value representing a control word bit register address to a corresponding stored control word value; and setting a particular state for the associated path selection element if the decoded control word bit register address matches a corresponding bit position value within the stored control word value.

Additional aspects of the one or more of the above methods include: programming the programmable map registers at least once after fabrication of the IC switch circuit; wherein the programmable map registers are implemented as fuses; enabling operation of one of the first bitwise comparator and the second bitwise comparator.

Fabrication Technologies and Options

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A circuit architecture for setting a switch state configuration of a radio frequency integrated circuit (IC) switch circuit, including:
   (a) at least one programmable map register, each for storing one or more programmable mapping values;
   (b) a first comparison circuit, coupled to at least one programmable map register, configured to receive at least one programmable mapping value from the coupled at least one programmable map register, and configured to receive at least one control word intended to select a state for a corresponding mapped path selection element of the IC switch circuit, for comparing a selected programmable mapping value to a corresponding control word and setting a particular state for the corresponding mapped path selection element if the compared values fully match; and
   (c) a second comparison circuit, coupled to at least one programmable map register through a decoder, configured to receive at least one decoded programmable mapping value representing a binary coded control word bit position from the coupled at least one programmable map register, and configured to receive at least one control word intended to select a state for a corresponding mapped path selection element of the IC switch circuit, for comparing a selected decoded binary coded programmable mapping value to a corresponding control word and setting a particular state for the corresponding mapped path selection element if the selected decoded binary coded programmable mapping value matches a corresponding bit position value within the control word.

2. A circuit architecture for setting a switch state configuration of a radio frequency integrated circuit (IC) switch circuit, including:
   (a) at least one control word register, each for storing a control word value intended to select a state for a corresponding path selection element of the IC switch circuit;
   (b) at least one programmable map register, each for storing programmed bit values associated with a path selection element of the IC switch circuit;
   (c) a first bitwise comparator, coupled to the at least one control word register and to the at least one programmable map register, for comparing binary coded bit values stored in a selected programmable map register to the control word value stored in a corresponding control word register, for setting a particular state for the path selection element associated with the selected programmable map register if the compared values fully match; and
   (d) a second bitwise comparator, coupled to the at least one control word register and coupled to the at least one programmable map register through a decoder, for comparing decoded binary coded bit values stored in a selected programmable map register, the binary coded bit values representing a control word bit register address, to the control word value stored in a corresponding control word register, for setting a particular state for the path selection element associated with the selected programmable map register if the decoded control word bit register address matches a corresponding bit position value within the control word value.

3. The invention of claim 2, wherein the programmable map registers are programmed at least once after fabrication of the IC switch circuit.

4. The invention of claim 2, wherein the programmable map registers are implemented as fuses.

5. The invention of claim 2, further including a selection control for enabling output of only one of the first bitwise comparator and the second bitwise comparator at a time.

6. The invention of claim 2, wherein at least one of the programmable map registers includes a control bit, the value of which selectively enables or disables at least one path selection element.

7. A dual-mode circuit architecture that enables switching between a direct mapping configuration and a fully decoded mapping configuration of a radio frequency integrated circuit (IC) switch circuit, including:

(a) at least one control word register, each for storing a control word value intended to select a state for a corresponding path selection element of the IC switch circuit;
(b) at least one programmable map register, each for storing programmed bit values associated with a path selection element of the IC switch circuit;
(c) a full-word bitwise comparator, coupled to the at least one control word register and to the at least one programmable map register, for comparing binary coded bit values stored in a selected programmable map register to the control word value stored in a corresponding control word register, for setting a particular state for the path selection element associated with the selected programmable map register if the compared values fully match;
(d) a single-bit position bitwise comparator, coupled to the at least one control word register and coupled to the at least one programmable map register through a decoder, for comparing decoded binary coded bit values stored in a selected programmable map register, the binary coded bit values representing a control word bit register address, to the control word value stored in a corresponding control word register, for setting a particular state for the path selection element associated with the selected programmable map register if the decoded control word bit register address matches a corresponding bit position value within the control word value; and
(e) a selection control for enabling output of only one of the full-word bitwise comparator and the single-bit position bitwise comparator at a time.

8. The invention of claim 7, wherein the programmable map registers are programmed at least once after fabrication of the IC switch circuit.

9. The invention of claim 7, wherein the map registers are implemented as fuses.

10. The invention of claim 7, wherein at least one of the programmable map registers includes a control bit, the value of which selectively enables or disables at least one path selection element.

11. A method for setting a switch state configuration of a radio frequency integrated circuit (IC) switch circuit, including the steps of:
(a) selectably comparing a control word value, intended to select a state for a corresponding path selection element of the IC switch circuit, to programmed binary coded bit values associated with a path selection element of the IC switch circuit, and setting a particular state for the path selection element associated with the programmed binary coded bit values if the compared values fully match;
(b) selectably comparing the control word value to decoded programmed binary coded bit values representing a control word value bit position within the control word value, and setting a particular state for the path selection element associated with the decoded programmed binary coded bit values if the decoded control word value bit position matches a corresponding bit position value within the control word value; and
(c) selecting only one of the step (a) or step (b) comparisons at a time.

12. A method for setting a switch state configuration of a radio frequency integrated circuit (IC) switch circuit, including:

(a) providing at least one control word register, each for storing a control word value intended to select a state for a corresponding path selection element of the IC switch circuit;
(b) providing at least one programmable map register, each for storing programmed bit values associated with a path selection element of the IC switch circuit;
(c) providing a first bitwise comparator, coupled to the at least one control word register and to the at least one programmable map register, for comparing binary coded bit values stored in a selected programmable map register to the control word value stored in a corresponding control word register, for setting a particular state for the path selection element associated with the selected programmable map register if the compared values fully match; and
(d) providing a second bitwise comparator, coupled to the at least one control word register and coupled to the at least one programmable map register through a decoder, for comparing decoded binary coded bit values stored in a selected programmable map register, the binary coded bit values representing a control word bit register address, to the control word value stored in a corresponding control word register, for setting a particular state for the path selection element associated with the selected programmable map register if the decoded control word bit register address matches a corresponding bit position value within the control word value.

13. The method of claim 12, further including programming the programmable map registers at least once after fabrication of the IC switch circuit.

14. The method of claim 12, further including initially configuring the programmable map registers of the IC switch circuit with a first set of bit values, and then programming the programmable map registers with a second set of bit values suitable for a particular application.

15. The method of claim 12, wherein the programmable map registers are implemented as fuses.

16. The method of claim 12, further including enabling output of only one of the first bitwise comparator and the second bitwise comparator at a time.

17. The method of claim 12, further including programming the programmable map registers to concurrently enable a plurality of path selection elements.

18. The method of claim 12, wherein at least one of the programmable map registers includes a control bit, the value of which selectively enables or disables at least one path selection element, and further including programming the control bit to selectively enable or disable at least one path selection element.

19. A method for enabling switching between a direct mapping configuration and a fully decoded mapping configuration of a radio frequency integrated circuit (IC) switch circuit, including:
(a) providing at least one control word register, each for storing a control word value intended to select a state for a corresponding path selection element of the IC switch circuit;
(b) providing at least one programmable map register, each for storing programmed bit values associated with a path selection element of the IC switch circuit;
(c) providing a full-word bitwise comparator, coupled to the at least one control word register and to the at least one programmable map register, for comparing binary coded bit values stored in a selected programmable map register with the control word value stored in a corresponding control word register, for setting a particular state for the path selection element associated with the selected programmable map register if the compared values fully match;

(d) providing a single-bit position bitwise comparator, coupled to the at least one control word register and coupled to the at least one programmable map register through a decoder, for comparing decoded binary coded bit values stored in a selected programmable map register, the binary coded bit values representing a control word bit register address, to the control word value stored in a corresponding control word register, for setting a particular state for the path selection element associated with the selected programmable map register if the decoded control word bit register address matches a corresponding bit position value within the control word value; and (e) enabling output of only one of the full-word bitwise comparator and the single-bit position bitwise comparator at a time.

20. The method of claim 19, further including programming the programmable map registers at least once after fabrication of the IC switch circuit.

21. The method of claim 19, further including initially configuring the programmable map registers of the IC switch circuit with a first set of bit values, and then programming the programmable map registers with a second set of bit values suitable for a particular application.

22. The method of claim 19, wherein the map registers are implemented as fuses.

23. The method of claim 19, further including programming the programmable map registers to concurrently enable a plurality of path selection elements.

24. The method of claim 19, wherein at least one of the programmable map registers includes a control bit, the value of which selectively enables or disables at least one path selection element, and further including programming the control bit to selectively enable or disable at least one path selection element.

25. A circuit architecture for setting a switch state configuration of a radio frequency integrated circuit (IC) switch circuit, including a comparison circuit, configured to receive at least one programmable binary coded mapping value representing a control word bit position and to receive at least one control word intended to select a state for a corresponding mapped path selection element of the IC switch circuit, for comparing a selected decoded binary coded mapping value to a corresponding control word and setting a particular state for the corresponding mapped path selection element if the selected decoded binary coded mapping value matches a corresponding bit position value within the control word.

26. A circuit architecture for setting a switch state configuration of a radio frequency integrated circuit (IC) switch circuit, including:

(a) at least one control word register, each for storing a control word value intended to select a state for a corresponding path selection element of the IC switch circuit;

(b) at least one programmable map register, each for storing programmed bit values associated with a path selection element of the IC switch circuit; and (c) a bitwise comparator, coupled to the at least one control word register and coupled to the at least one programmable map register through a decoder, for comparing decoded binary coded bit values stored in a selected programmable map register, the binary coded bit values representing a control word bit register address, to the control word value stored in a corresponding control word register, for setting a particular state for the path selection element associated with the selected programmable map register if the decoded control word bit register address matches a corresponding bit position value within the control word value.

27. The invention of claim 26, wherein the programmable map registers are programmed at least once after fabrication of the IC switch circuit.

28. The invention of claim 26, wherein the programmable map registers are implemented as fuses.

29. The invention of claim 26, wherein at least one of the programmable map registers includes a control bit, the value of which selectively enables or disables at least one path selection element.

30. A method for setting a switch state configuration of a radio frequency integrated circuit (IC) switch circuit, including:

(a) providing at least one programmable map register, each for storing one or more programmable binary coded mapping values;

(b) configuring a comparison circuit to receive at least one programmable binary coded mapping value from at least one programmable map register, each programmable binary coded mapping value representing a control word bit position and to receive at least one control word intended to select a state for a corresponding mapped path selection element of the IC switch circuit;

(c) comparing a selected decoded binary coded mapping value to a corresponding control word; and (d) setting a particular state for the corresponding mapped path selection element if the selected decoded binary coded mapping value matches a corresponding bit position value within the control word.

31. A method for setting a switch state configuration of a radio frequency integrated circuit (IC) switch circuit, including:

(a) storing at least one control word value intended to select a state for a corresponding path selection element of the IC switch circuit;

(b) storing at least one programmed bit value associated with a path selection element of the IC switch circuit;

(c) bitwise comparing a decoded binary coded bit value representing a control word bit register address to a corresponding stored control word value; and (d) setting a particular state for the associated path selection element if the decoded control word bit register address matches a corresponding bit position value within the stored control word value.

32. The method of claim 31, further including programming the programmed bit values at least once after fabrication of the IC switch circuit.

33. The method of claim 31, further including initially configuring the programmed bit values with a first set of bit values, and then programming the programmed bit values with a second set of bit values suitable for a particular application.

* * * * *